United States Patent
Yu et al.

(10) Patent No.: US 6,894,355 B1
(45) Date of Patent: May 17, 2005

(54) SEMICONDUCTOR DEVICE WITH SILICIDE SOURCE/DRAIN AND HIGH-K DIELECTRIC

(75) Inventors: Bin Yu, Cupertino, CA (US); Olov Karlsson, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 90 days.

(21) Appl. No.: 10/044,493

(22) Filed: Jan. 11, 2002

(51) Int. Cl.[7] ............................................. H01L 27/01
(52) U.S. Cl. ................................. 257/382; 257/347
(58) Field of Search ............................... 257/347, 288, 257/368, 348, 384, 454, 455, 456, 471, 310, 377, 382, 754, 755, 757, 768–770

(56) References Cited

U.S. PATENT DOCUMENTS

| | | | |
|---|---|---|---|
| 4,080,719 A | * | 3/1978 | Wilting |
| 4,419,812 A | * | 12/1983 | Topich |
| 4,657,628 A | * | 4/1987 | Holloway et al. |
| 5,661,043 A | * | 8/1997 | Rissman et al. |
| 5,693,554 A | * | 12/1997 | Lee |
| 5,736,435 A | * | 4/1998 | Venkatesan et al. |
| 5,851,921 A | * | 12/1998 | Gardner et al. |
| 5,937,315 A | * | 8/1999 | Xiang et al. |
| 5,989,957 A | | 11/1999 | Ngo et al. |
| 6,002,150 A | * | 12/1999 | Gardner et al. |
| 6,013,553 A | | 1/2000 | Wallace et al. |
| 6,020,024 A | | 2/2000 | Maiti et al. |
| 6,060,755 A | * | 5/2000 | Ma et al. |
| 6,100,204 A | | 8/2000 | Gardner et al. |
| 6,160,291 A | * | 12/2000 | Imai |
| 6,210,999 B1 | | 4/2001 | Gardner et al. |
| 6,278,165 B1 | * | 8/2001 | Oowaki et al. |
| 6,291,282 B1 | * | 9/2001 | Wilk et al. |
| 6,303,479 B1 | * | 10/2001 | Snyder |
| 6,423,619 B1 | * | 7/2002 | Grant et al. |
| 6,555,424 B2 | * | 4/2003 | Lin et al. |
| 6,590,271 B2 | * | 7/2003 | Liu et al. |
| 2001/0031562 A1 | * | 10/2001 | Raajimakers et al. |

OTHER PUBLICATIONS

Poon et al., "Thermal stability of cobalt and nickel silicides in amorphous and crystalline silicon," Proceedings of Electron Devices Meeting, 1997, IEEE, p. 65–68.*

* cited by examiner

Primary Examiner—Nathan J. Flynn
Assistant Examiner—Kevin Quinto
(74) Attorney, Agent, or Firm—Renner, Otto, Boisselle & Sklar, LLP

(57) ABSTRACT

A semiconductor device and method of manufacture. The semiconductor device having a silicide source and a silicide drain; a semiconductor body disposed between the source and the drain; a gate electrode disposed over the body and defining a channel interposed between the source and the drain; and a gate dielectric made from a high-K material and separating the gate electrode and the body.

10 Claims, 2 Drawing Sheets

SEMICONDUCTOR DEVICE WITH SILICIDE SOURCE/DRAIN AND HIGH-K DIELECTRIC

TECHNICAL FIELD

The present invention relates generally to semiconductor devices and the fabrication thereof and, more particularly, to a semiconductor device having a metal containing source, a metal containing drain and a dielectric made from high-K material.

BACKGROUND

A pervasive trend in modern integrated circuit manufacture is to produce semiconductor devices, such as metal oxide semiconductor field effect transistors (MOSFETs), that are as small as possible. In a typical MOSFET, a source and a drain are formed in an active region of a semiconductor layer by implanting N-type or P-type impurities in the layer of semiconductor material. Disposed between the source and the drain is a channel (or body) region. Disposed above the body region is a gate electrode. The gate electrode and the body are spaced apart by a gate dielectric layer. It is noted that MOSFETs can be formed in bulk format (for example, the active region being formed in a silicon substrate) or in a semiconductor-on-insulator (SOI) format (for example, in a silicon film that is disposed on an insulating layer that is, in turn, disposed on a silicon substrate).

Although the fabrication of smaller transistors allows more transistors to be placed on a single monolithic substrate for the formation of relatively large circuit systems in a relatively small die area, this downscaling can result in a number of performance degrading effects. For example, certain materials selected to be used in a down-scaled device may react with other materials when a thermal budget for the materials is exceeded (for example and depending on the material, when an anneal cycle approaches about 1000° C.).

Accordingly, there exists a need in the art for semiconductor devices, such as MOSFETs, that optimize scale and performance. There also exists a need for corresponding fabrication techniques to make those semiconductor devices.

SUMMARY OF THE INVENTION

According to one aspect of the invention, a semiconductor device having a silicide source and a silicide drain; a semiconductor body disposed between the source and the drain; a gate electrode disposed over the body and defining a channel interposed between the source and the drain; and a gate dielectric made from a high-K material and separating the gate electrode and the body.

According to another aspect of the invention, a method of fabricating a semiconductor device. The method including providing a wafer including a layer of semiconductor material; forming a layer of high-K dielectric material over the layer of semiconductor material; forming a gate electrode over the layer of high-K material; removing a portion of the layer of high-K dielectric material extending laterally beyond the gate electrode to form a gate dielectric, the gate electrode and the gate dielectric forming a gate having laterally opposed sidewalls; forming a liner disposed adjacent each sidewall of the gate electrode; and siliciding the layer of semiconductor material to form a metal containing source and a metal containing drain, thereby forming a semiconductor body between the source and the drain, the body having a channel defined by the gate electrode.

BRIEF DESCRIPTION OF DRAWINGS

These and further features of the present invention will be apparent with reference to the following description and drawings, wherein.

DISCLOSURE OF INVENTION

Figure 1:
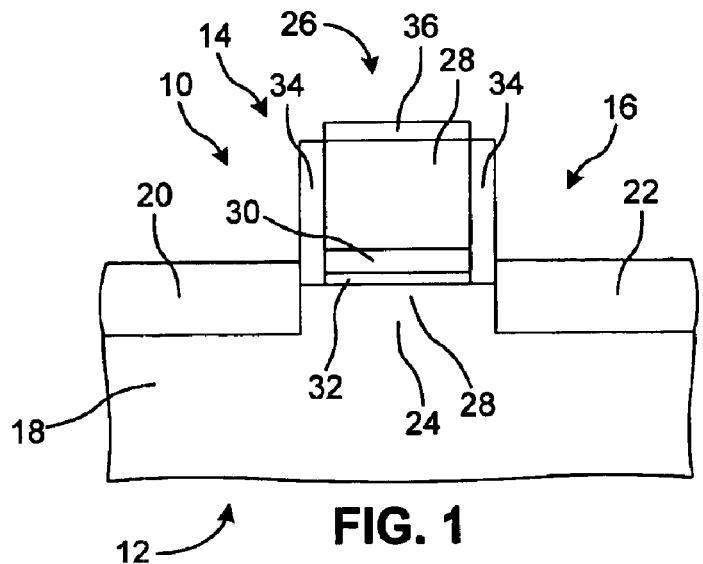
FIG. 1 is a schematic block diagram of a semiconductor device formed in accordance with one aspect of the present invention.

In the detailed description that follows, identical components have been given the same reference numerals, regardless of whether they are shown in different embodiments of the present invention. To illustrate the present invention in a clear and concise manner, the drawings may not necessarily be to scale and certain features may be shown in somewhat schematic form.

With reference to FIG. 1, a semiconductor device 10 fabricated on a wafer 12 according to an example embodiment of the present invention is illustrated. The illustrated semiconductor device 10 is a metal oxide semiconductor field effect transistors (MOSFET) used, for example, in the construction of a complimentary metal oxide semiconductor (CMOS) integrated circuit. As one skilled in the art will appreciate, the structures and the techniques for fabricating the semiconductor device 10 described herein can be used for other types of semiconductors (e.g., other types of transistors, memory cells, etc.) and the illustrated MOSFET is merely exemplary. However, to clearly and concisely set forth the present invention, the semiconductor device 10 will sometimes be referred to herein as a MOSFET 14. Although only one MOSFET 14 is illustrated, one skilled in the art will appreciate that the illustrated device is merely exemplary and multiple MOSFETs (including NMOS devices and/or PMOS devices) can be formed on the wafer 12. Multiple semiconductor devices 10 formed from the wafer can be separated by isolation regions (not shown) as are well known in the art.

The MOSFET 14 is formed using an active region 16 formed in a layer of semiconductor material 18. In the illustrated example of FIG. 1, the layer of semiconductor material 18 is a semiconductor substrate used for the formation of "bulk" type devices. The semiconductor substrate can be made from silicon, but other semiconductor materials (e.g., silicon-germanium, germanium, etc.) could also be used. Alternatively, the layer of semiconductor material 18 can be a semiconductor film (for example, comprised of silicon, silicon-germanium, or the like) formed on a layer of insulating material (for example, a buried oxide (BOX) layer). The insulating layer is, in turn, formed on a semiconductor substrate (also referred to in the art as a handle wafer) so that devices formed on the wafer 12 are formed in a semiconductor-on-insulator (SOI) format.

The active region 16 includes a source 20, a drain 22 and a body 24 disposed between the source 20 and the drain 22. The source 20 and the drain 22 can be formed from a metal or metal-containing compound. In one embodiment of the invention, the source 20 and the drain 22 are formed by siliciding the layer of semiconductor material 18. Without intending to be bound by theory, a metal or metal containing source 20 and drain 22 provide for low-parasitic resistance and forms a Schottky junction between the source/drain 20/22 and the layer of semiconductor material 18 including the body region 24. Schottky junctions have a nonlinear rectifying characteristic such that majority carriers are predominate. As a result, there is very little injection or storage of minority carriers that could otherwise limit switching speed.

A gate 26 is disposed on the layer of semiconductor material 18 over the body 24 and defines a channel 28 within the body 24 (the channel 28 being interposed between the source 20 and the drain 22 and controlled by a work function of the gate 26). The gate 26 includes a gate electrode 28 spaced apart from the layer of semiconductor material 18 by a gate dielectric 30. In one embodiment, the gate electrode 28 can be made from a metal (e.g., tungsten, tantalum, aluminum, nickel, ruthenium, rhodium, palladium, platinum, titanium, molybdenum, etc) or a metal containing compound (e.g., titanium nitride, tantalum nitride, etc.). Alternatively, a semiconductor (e.g., polycrystalline silicon, polycrystalline silicon-germanium, etc.) could also be used for the gate electrode 28.

In one embodiment, the gate dielectric 30 is made from a high-K material or stack of materials to form a high-K dielectric stack. As used herein, a "high-K material" or a "high-K dielectric material" refers to a material, or stack of materials, having a relative permittivity in one embodiment of about ten (10) or more, and in another embodiment of about twenty (20) or more. Relative permittivity is the ratio of the absolute permittivity ($\epsilon$) found by measuring capacitance of the material to the permittivity of free space ($\epsilon_o$) that is $K=\epsilon/\epsilon_o$. High-K materials will be described in greater detail below. Although other materials can be selected for the gate dielectric 30, hafnium oxide (e.g., $HfO_2$), zirconium oxide (e.g., $ZrO_2$), cerium oxide (e.g., $CeO_2$), aluminum oxide (e.g., $Al_2O_3$), titanium oxide (e.g., $TiO_2$), yttrium oxide (e.g., $Y_2O_3$) and barium strontium titanate (BST) are example suitable materials for the gate dielectric 30. In addition, all binary and ternary metal oxides and ferroelectric materials having a K higher than, in one embodiment, about twenty (20) can be used for the gate dielectric 30.

In an alternative embodiment, the gate dielectric 30 can be made from a standard-K material. As used herein, the term "standard-K dielectric material" or "standard-K dielectric material refers to a dielectric material having a relative permittivity, or K, of up to about ten (10). Example standard-K materials include, for example, silicon dioxide (K of about 3.9), silicon oxynitride (K of about 4 to 8 depending on the relative content of oxygen and nitrogen) and silicon nitride (K of about 6 to 9).

When a high-K material is selected as the gate dielectric 30, the high-K material can have an equivalent oxide thickness (EOT) of about one nanometer (1 nm) or less. In the semiconductor device 10 described herein, a gate dielectric made from a high-K material may be desirable to minimize performance degrading effects, such as leakage, that may occur when the thickness of a standard-K dielectric material becomes thin (e.g., approaching about 10 Å). A high-K dielectric allows for the establishment of a suitable capacitance with a physically thicker dielectric layer. For example, a nitride gate dielectric having a K of about 7.8 and a thickness of about 100 Å is substantially electrically equivalent to an oxide gate dielectric having a K of about 3.9 and a thickness of about 50 Å. In addition, devices fabricated with a high-K dielectric layer tend to have improved reliability.

When a high-K material is selected as the gate dielectric 30, a buffer interface 32 optionally can be used between the layer of semiconductor material 18 and the gate dielectric 30. The buffer interface 32 can be, for example, an oxide layer having a thickness of about 0.5 nm to about 0.7 nm. The buffer interface 32 acts to reduce diffusion and/or penetration of atoms from the high-K dielectric material into the layer of semiconductor material 18 that could lead to a degradation in channel mobility. In addition, the buffer interface 32 may act to retard reaction of the high-K material with the layer of semiconductor material 18.

The MOSFET 14 can be provided with a liner 34 disposed adjacent each sidewall of the gate 26 to assist in fabrication of the MOSFET 14 as will be described in greater detail below. The liners 34 can be made from an oxide (e.g., silicon oxide) and can have a width of about 50 Å to about 150 Å. Also, the MOSFET 14 optionally can be provided with a gate electrode contact 36 used in establishing electrical connection to the gate electrode 26. Source 20 and drain 22 contacts (not shown), if desired, can also be provided. Other components, such as a cap (or passivation) layer (not shown), vias (not shown), and conductor lines (not shown) to interconnect devices formed on the wafer 14, can also be provided.

Figure 2:
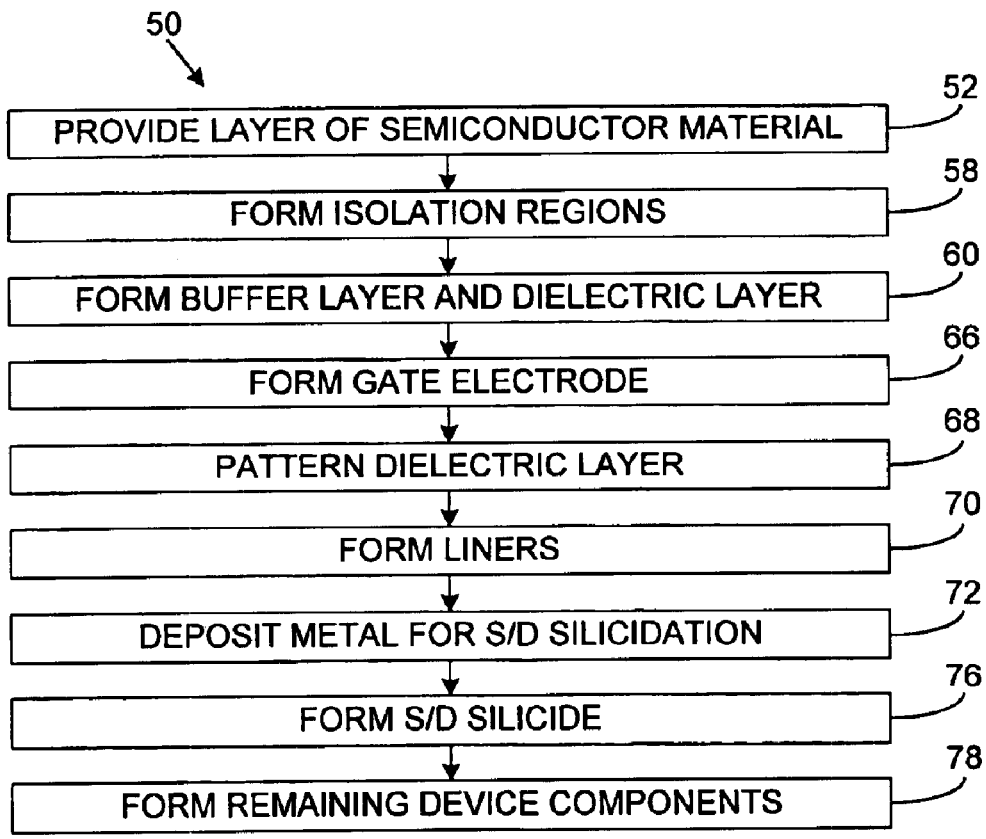
FIG. 2 is a flow chart illustrating a method of forming the semiconductor device of FIG. 1.
Figure 3A:
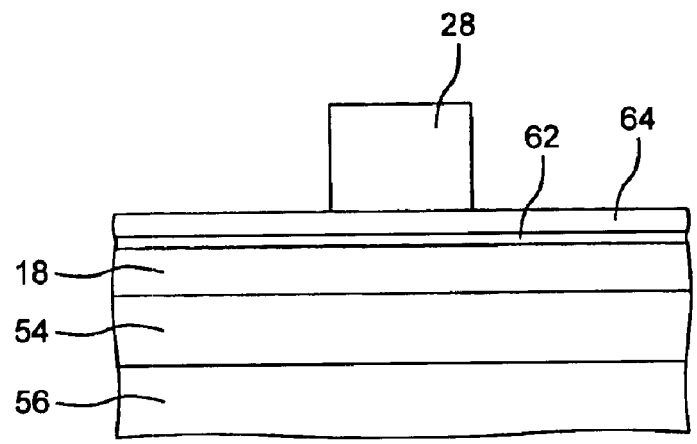
FIGS. 3A through 3C illustrate the semiconductor device of FIG. 1 in various stages of manufacture.
Figure 3B:
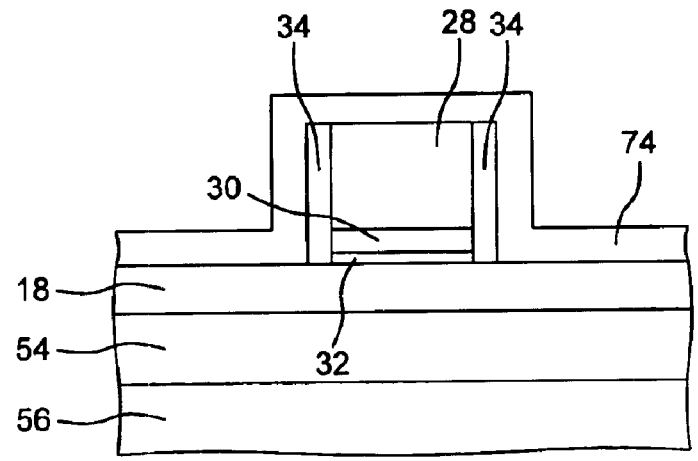
Figure 3C:
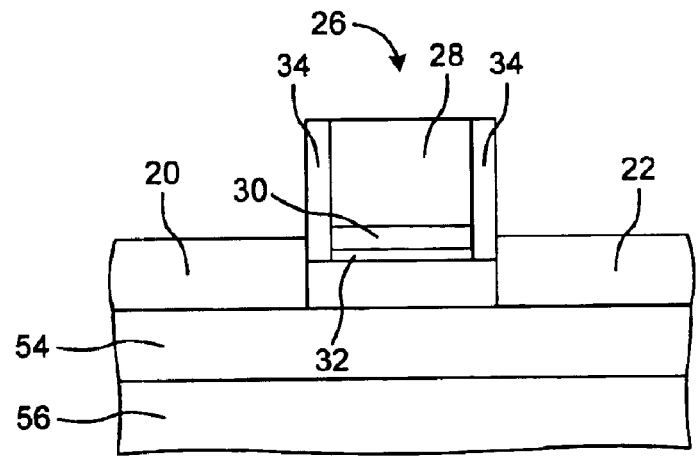

Referring now to FIG. 2, a method 50 of forming the MOSFET 14 is illustrated. With additional reference to FIG. 3A, the method 50 starts in step 52 where the layer of semiconductor material 18 is provided. As indicated above, the layer of semiconductor material 18 can be a semiconductor substrate, such as a silicon substrate. Alternatively, and as illustrated in FIGS. 3A–3C, the layer of semiconductor material 18 can be a semiconductor film (such as a silicon film or a silicon-germanium film) formed on an insulating layer 54 (such as a BOX layer). The isolation layer 54 can be formed on a semiconductor substrate 56 (such as a silicon substrate) so as to form an SOI substrate stack. If appropriate, the layer of semiconductor material 18 can be doped with N-type and/or P-type dopant for used in the formation of N-type body regions 24 and/or P-type body regions 24 (including, for example, N-type and/or P-type wells for a bulk-type device).

Next, in step 58 and if desired, isolation regions can be formed. Although not shown, the isolation regions define the size and placement of the active regions 16 (FIG. 1). The formation of isolation regions is well known in the art and will not be described in great detail. The isolation regions can be formed using a shallow trench isolation (STI) formation technique as is conventional.

Next, in step 60, a buffer interface material layer 62 optionally can be formed on the layer of semiconductor material 22. As indicated, the buffer interface material layer 62 can be a thin layer of oxide. For example, the buffer interface material layer 62 can be a layer of silicon oxide that is about 0.5 nm to about 0.7 nm thick. The buffer interface material layer 62 can be formed by a low temperature (about 500° C.) thermal oxidation process, a remote plasma deposition process, an atomic layer deposition (ALD) process or the like. The buffer interface material layer 62 assists in reducing integration issues that may arise when attempting form a layer of high-K material on a semiconductor layer. Therefore, if the gate dielectric is formed from a standard-K material or if the buffer interface 32 is not desired, the buffer interface material layer 62 can be omitted.

Also in step 60, a layer of dielectric material 64 is formed on the buffer interface material layer 62 (if the buffer interface material layer 62 is omitted, the layer of dielectric material 64 can be formed on the layer of semiconductor material 18 or other intermediate layer formed in place of the buffer interface material layer 62). As indicated above, the layer of dielectric material 64 can be a standard-K dielectric material. Alternatively, the layer of dielectric material 64 is formed from a high-K dielectric material or a stack of materials that, in combination, have high-K dielectric properties.

Exemplary high-K materials are identified below in Table 1. It is noted that Table 1 is not an exhaustive list of high-K materials and other high-K materials may be available.

TABLE 1

| Dielectric Material | Approximate Relative Permittivity (K) |
|---|---|
| aluminum oxide ($Al_2O_3$) | 9–10 |
| zirconium silicate | 12 |
| hafnium silicate | 15 |
| hafnium silicon oxynitride | 16 |
| hafnium silicon nitride | 18 |
| lanthanum oxide ($La_2O_3$) | 20–30 |
| hafnium oxide ($HfO_2$) | 40 |
| zirconium oxide ($ZrO_2$) | 25 |
| cerium oxide ($CeO_2$) | 26 |
| bismuth silicon oxide ($Bi_4Si_2O_{12}$) | 35–75 |
| titanium dioxide ($TiO_2$) | 30 |
| tantalum oxide ($Ta_2O_5$) | 26 |
| tungsten oxide ($WO_3$) | 42 |
| yttrium oxide ($Y_2O_3$) | 20 |
| lanthanum aluminum oxide ($LaAlO_3$) | 25 |
| barium strontium titanate ($Ba_{1-x}Sr_xTiO_3$) | ~20—200 |
| barium strontium oxide ($Ba_{1-x}Sr_xO_3$) | ~20—200 |
| $PbTiO_3$ | ~20—200 |
| barium titanate ($BaTiO_3$) | ~20—200 |
| strontium titanate ($SrTiO_3$) | ~20—200 |
| $PbZrO_3$ | ~20—200 |
| PST ($PbSc_xTa_{1-x}O_3$) | 3000 |
| PZN ($PbZn_xNb_{1-x}O_3$) | ~500—5000 |
| PZT ($PbZr_xTi_{1-x}O_3$) | ~150—1000 |
| PMN ($PbMg_xNb_{1-x}O_3$) | ~500—5000 |

It is noted that the K-values for both standard-K and high-K materials may vary to some degree depending on the exact nature of the dielectric material. Thus, for example, differences in purity, crystallinity and stoichiometry, may give rise to variations in the exact K-value determined for any particular dielectric material.

As used herein, when a material is referred to by a specific chemical name or formula, the material may include non-stoichiometric variations of the stoichiometrically exact formula identified by the chemical name. For example, tantalum oxide, when stoichiometrically exact, has the chemical formula $Ta_2O_5$, but may include variants of stoichiometric $Ta_2O_5$, which may be referred to as $Ta_2O_y$, in which either of x or y vary by a small amount. For example, in one embodiment, x may vary from about 1.5 to 2.5, and y may vary from about 4.5 to about 5.5. In another embodiment, x may vary from about 1.75 to 2.25, and y may vary from about 4 to about 6. Such variations from the exact stoichiometric formula fall within the definition of tantalum oxide. Similar variations from exact stoichiometry for all chemical names or formulas used herein are intended to fall within the scope of the present invention. For example, again using tantalum oxide, when the formula $Ta_2O_5$ is used, $Ta_xO_y$ is included within the meaning. Thus, in the present disclosure, exact stoichiometry is intended only when such is explicitly so stated. As will be understood by those of skill in the art, such variations may occur naturally, or may be sought and controlled by selection and control of the conditions under which materials are formed.

With continued reference to FIGS. 2. and 3A, the method 50 continues in step 66 where the gate electrode 28 is formed. The gate electrode 28 can be formed by depositing a layer of gate electrode material and patterning the layer of gate electrode material (for example, by using a photoresist and wet-chemical etch). In one embodiment of the MOSFET 14, the material of gate electrode 28 can be selected for use in an NMOS device, such as a metal (e.g., tungsten, tantalum, aluminum, etc.) or a metal containing compound (e.g., titanium nitride, tantalum nitride, etc.). If desired, a doped semiconductor (e.g., polycrystalline silicon, polycrystalline silicon-germanium, etc.) could alternatively be used. In another embodiment, the material of the gate electrode 28 can be selected for use in a PMOS device, such as a metal (e.g., tungsten, nickel, ruthenium, rhodium, palladium, platinum, etc.) or a metal containing compound (e.g., titanium nitride, tantalum nitride, etc.). If desired, a doped semiconductor (e.g., polycrystalline silicon, polycrystalline silicon-germanium, etc.) could alternatively be used. As one skilled in the art will appreciate, step 66 can be modified to form gate electrodes 28 for both NMOS devices and PMOS devices on the wafer 12.

With additional reference to FIG. 3B, the layer of dielectric material 64 and, if present, the buffer interface material layer 62 are patterned to be coextensive with the gate electrode 28 in step 68. Thereafter, in step 70, the liners 34 are formed. The liners 34 can be made from an oxide (e.g., silicon oxide) and can have a width of about 50 Å to about 150 Å. The liners 34 can be formed, for example, by a deposit and etch technique as is well known in the art. The liners 34 act to isolate the gate 26 during processing steps to form the source 20 and the drain 22 as discussed in greater detail below. Should the gate electrode 28 be formed from a semiconductor material, an optional cap (not shown) can also be formed on top of the gate electrode 28. If present, the cap can be made from a dielectric material, such as silicon nitride (e.g., $Si_2N_4$). Techniques for forming the cap are well known in the art and will not be described in detail.

Next, in step 72, a conformal metal layer 74 used in the formation of silicide for the source 20 (FIG. 1) and the drain 22 (FIG. 1) is deposited. In one embodiment, the metal layer 74 is nickel (Ni). Alternatively, the metal layer 74 can be titanium, cobalt, platinum, molybdenum, or other suitable material for the formation of a silicide source 20 and a silicide drain 22. Deposition techniques for forming the metal layer 74, such as sputtering, are well known in the art and will not be described in greater detail.

Next, in step 76 and with additional reference to FIG. 3C, the metal layer 74 is reacted with the layer of semiconductor material 18 to form silicide. In one embodiment, the layer of semiconductor material 18 is sufficiently reacted such that the source 20 and the drain 22 are formed from silicide. If the wafer 12 is formed in SOI format, the layer of semiconductor material 18 can be reacted down to the isolation layer 54. Although not illustrated, the silicide may laterally diffuse under the liners 34 and possibly under the gate 26. Reaction of the metal layer 74 with the layer of semiconductor material 18 includes annealing the wafer 12. For example, if nickel is used for the metal layer 74, the wafer can be annealed at a relative low temperature (about 350° C. to about 450° C.).

Thereafter, in step 78, any additional processing to form the MOSFET 14 can be carried out. For example, the gate contact 36 (FIG. 1) can be formed. In addition, components to interconnect the MOSFET 14 with other devices formed on the wafer 14 can be constructed.

It is noted that many high-K materials can have a tendency to react with adjacent semiconductor material layers (e.g., the layer of semiconductor material 18 and/or the gate electrode 28 if made from a semiconductor material such as polycrystalline silicon) when a thermal budget for the high-K material is exceeded. In addition, exceeding a thermal budget for the high-K material may cause metal atoms to diffuse and/or penetrate into the layer of semiconductor material 18, which could degrade channel mobility. The semiconductor device 10 described herein is formed without conventional ion implant implantation to form source and drain extensions and deep implant regions (i.e., diffusion source/drain junctions). Ion implantation is usually followed by an associated anneal cycle(s) to activate those dopant species and/or to recrystalize the layer of semiconductor material. Therefore, the high-K materials used to form the gate dielectrics are not subjected to certain thermal processing typically carried out in the fabrication of many semiconductor devices. Without intending to be bound by theory, it is believed that the foregoing thermal budget issue is minimized for the semiconductor device 10 described herein.

The method 50 shows a specific order of steps for fabricating the MOSFET 14. However, it is understood that the order may differ from that depicted. For example, the order of two or more steps may be altered relative to the order shown. Also, two or more steps may be carried out concurrently or with partial concurrence. In addition, various steps may be omitted and other steps may be added. Furthermore, the method 50 can be modified for the formation of devices other than MOSFETs (e.g., a memory cell, another type of transistor, etc.). It is understood that all such variations are within the scope of the present invention.

Although particular embodiments of the invention have been described in detail, it is understood that the invention is not limited correspondingly in scope, but includes all changes, modifications and equivalents coming within the spirit and terms of the claims appended hereto.

What is claimed is:

1. A semiconductor device comprising:
   a source and a drain, said source and drain consisting essentially of silicide;
   a body formed from a semiconductor film disposed on an insulating layer, the insulting layer being disposed on a semiconductor substrate, the semiconductor film portion of the body being disposed between the source and the drain;
   a gate electrode disposed over the body and defining a channel interposed between the source and the drain;
   a gate dielectric separating the gate electrode and the body, said gate dielectric being made from a material having a relative permittivity of greater than about 10;
   a buffer interface disposed between the body and the gate dielectric; the buffer interface having a length equal to a length of the gate electrode;
   wherein a top portion of the source and a top portion of the drain are disposed at vertical heights that are at least as high as a portion of the gate dielectric; and
   wherein a bottom portion of the source and a bottom portion of the drain are each in physical contact with the insulating layer.

2. The semiconductor device according to claim 1, wherein the semiconductor device is configured as a MOSFET.

3. The semiconductor device according to claim 1, wherein the gate dielectric is composed of one or more materials selected from hafnium oxide, zirconium oxide, cerium oxide, aluminum oxide, titanium oxide, yttrium oxide, barium strontium titanate and mixtures thereof.

4. The semiconductor device according to claim 1, wherein the buffer interface is formed from an oxide having a thickness of about 0.5 nm to about 0.7 nm.

5. The semiconductor device according to claim 1, wherein the silicide of the source and the drain is formed by reacting nickel with a layer of semiconductor material, the body being formed from the layer of semiconductor material.

6. The semiconductor device according to claim 1, further comprising a liner disposed adjacent sidewalls defined by the gate electrode and gate dielectric.

7. The semiconductor device according to claim 1, wherein the gate is comprised of a metal containing material.

8. The semiconductor device according to claim 7, wherein the gate electrode is composed of one or more materials selected from titanium nitride, tantalum nitride, tungsten, tantalum, aluminum, nickel, ruthenium, rhodium, palladium, platinum and combinations thereof.

9. A semiconductor device comprising:
   a source and a drain, said source and drain consisting essentially of silicide;
   a body formed from a semiconductor film disposed on an insulating layer, the insulating layer being disposed on a semiconductor substrate, the semiconductor film portion of the body being disposed between the source and the drain, wherein a source/body junction is defined by silicide material of the source and the semiconductor film of the body and a drain/body junction is defined by silicide material of the drain and the semiconductor film of the body;
   a gate electrode disposed over the body and defining a channel interposed between the source and the drain;
   a gate dielectric separating the gate electrode and the body, said gate dielectric being made from a material having a relative permittivity greater than about 10;
   a buffer interface disposed between the body and the gate dielectric; the buffer interface having a length equal to a length of the gate electrode;
   wherein a top portion of the source and a top portion of the drain are disposed at vertical heights that are at least as high as a portion of the gate dielectric; and
   wherein a bottom portion of the source and a bottom portion of the drain are each in physical contact with the insulating layer.

10. A semiconductor device comprising:
   a source and a drain, said source and drain consisting of silicide;
   a body formed from a semiconductor film disposed on an insulating layer, the insulting layer being disposed on a semiconductor substrate, the semiconductor film portion of the body being disposed between the source and the drain;
   a gate electrode disposed over the body and defining a channel interposed between the source and the drain; and
   a high-K gate dielectric separating the gate electrode and the body, said high-K gate dielectric being made from a material having a relative permittivity of greater than about 10;
   buffer interface disposed between the body and the gate dielectric; the buffer interface having a length equal to a length of the gate electrode;
   wherein a top portion of the source and a top portion of the drain are disposed at vertical heights that are at least as high as a portion of the gate dielectric; and
   wherein a bottom portion of the source and a bottom portion of the drain are each in physical contact with the insulating layer.

* * * * *

UNITED STATES PATENT AND TRADEMARK OFFICE
CERTIFICATE OF CORRECTION

PATENT NO. : 6,894,355 B1
DATED : May 17, 2005
INVENTOR(S) : Yu et al.

It is certified that error appears in the above-identified patent and that said Letters Patent is hereby corrected as shown below:

Column 3,
Line 29, replace "($\varepsilon_0$) that" with -- ($\varepsilon_0$), that -- .

Column 5,
Line 48, replace "$Ta_2O_y$" with -- $Ta_xO_y$ --.

Signed and Sealed this

Sixteenth Day of August, 2005

JON W. DUDAS
*Director of the United States Patent and Trademark Office*